(12) United States Patent
Samejima et al.

(10) Patent No.: US 8,134,085 B2
(45) Date of Patent: Mar. 13, 2012

(54) PRINTED INTERCONNECTION BOARD HAVING A CORE INCLUDING CARBON FIBER REINFORCED PLASTIC

(75) Inventors: Sohei Samejima, Chiyoda-ku (JP); Sadao Sato, Amagasaki (JP); Tsuyoshi Ozaki, Chiyoda-ku (JP); Hiroyuki Osuga, Chiyoda-ku (JP); Teruhiko Kumada, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 673 days.

(21) Appl. No.: 12/259,624

(22) Filed: Oct. 28, 2008

(65) Prior Publication Data

US 2009/0107702 A1    Apr. 30, 2009

(30) Foreign Application Priority Data

Oct. 29, 2007  (JP) ................. 2007-280422
Aug. 7, 2008   (JP) ................. 2008-204309

(51) Int. Cl.
*H05K 1/11* (2006.01)
(52) U.S. Cl. ........................ 174/262; 174/266
(58) Field of Classification Search .......... 174/250–268; 361/748–803
See application file for complete search history.

(56) References Cited

U.S. PATENT DOCUMENTS

| | | | |
|---|---|---|---|
| 6,869,664 B2 | 3/2005 | Vasoya et al. | |
| 7,224,046 B2 * | 5/2007 | Abe et al. | 257/668 |
| 7,722,950 B2 * | 5/2010 | Guo et al. | 428/356 |
| 2003/0136577 A1 * | 7/2003 | Abe | 174/255 |
| 2006/0175084 A1 * | 8/2006 | Okamoto et al. | 174/262 |
| 2008/0011507 A1 * | 1/2008 | Vasoya | 174/260 |

FOREIGN PATENT DOCUMENTS

JP    11-40902    2/1999

OTHER PUBLICATIONS

U.S. Appl. No. 13/142,113, filed Aug. 18, 2011, Samejima et al.

* cited by examiner

*Primary Examiner* — Zachary M Pape
(74) *Attorney, Agent, or Firm* — Oblon, Spivak, McClelland, Maier & Neustadt, L.L.P.

(57) ABSTRACT

A CFRP core including a CFRP layer has a primary through hole. An adhesive member coats a wall surface of the primary through hole, and has a secondary through hole extending within the primary through hole. An electrically conductive layer is formed on a wall surface of the secondary through hole for electrically connecting upper and lower signal interconnections via the secondary through hole. A coating layer coats an outer peripheral edge of the CFRP core as seen in a plan view. Thereby, a printed interconnection board with low thermal expansivity and high thermal conductivity capable of preventing exfoliation of a CFRP layer on a side surface of a substrate using CFRP as a core, as well as preventing falling-off of carbon powders from the CFRP layer, and a method of manufacturing the same can be obtained.

8 Claims, 19 Drawing Sheets

PRINTED INTERCONNECTION BOARD HAVING A CORE INCLUDING CARBON FIBER REINFORCED PLASTIC

BACKGROUND OF THE INVENTION

1. Field of the Invention

The present invention relates to a printed interconnection board and a method of manufacturing the same, and in particular, to a printed interconnection board having a core including carbon fiber reinforced plastic and a method of manufacturing the same.

2. Description of the Background Art

In recent years, it has become desirable for printed interconnection boards to include a substrate with an excellent heat dissipation property, as electronic components are mounted in higher density. A metal core substrate has been known as a printed interconnection board excellent in heat dissipation property, and has already been put to practical use. The metal core substrate uses a metal having high thermal conductivity, such as aluminum (Al), copper (Cu), or the like, as a core material, and thereby can dissipate heat from a heat-generating component throughout the substrate and suppress an increase in the temperature of the heat-generating component. Above all, aluminum, which has a low specific gravity, is generally used as a core material.

However, aluminum has a high coefficient of thermal expansion of approximately 24 ppm/° C., whereas a ceramic component has a low coefficient of thermal expansion of approximately 7 ppm/° C. Therefore, there arises a problem that when a heat cycle test is conducted, a crack occurs at a solder joint portion due to a difference in the coefficients of thermal expansion of aluminum and the ceramic component, failing to achieve mounting reliability.

As a core material capable of solving the above problem, carbon fiber reinforced plastic (hereinafter referred to as CFRP) has been known (for example, see Japanese Patent Laying-Open No. 11-040902). CFRP is a composite material including carbon fiber and resin, and has properties such as low thermal expansivity (±2 ppm/° C.), high thermal conductivity (140 to 800 W/m·K), and low specific gravity (1.6 g/cm³). If a core substrate can be fabricated using this CFRP, a substrate with high thermal conductivity and more excellent in mounting reliability than aluminum can be obtained.

Since a CFRP core substrate possesses electrical conductivity as with other metal cores, it is necessary to insulate it from a penetrating through hole for connecting interconnections provided above and below the core.

However, there has been a problem that, in a substrate using CFRP prepared by laminating prepregs including unidirectional carbon fiber at angles of 0°, 90°, 90°, and 0° as a core material, exfoliation occurs in a CFRP layer on a side surface of the substrate in a heat cycle test. This is attributed to the fact that stress caused by a difference between a coefficient of thermal expansion of the CFRP and coefficients of thermal expansion of a substrate material and copper is stronger than adhesion strength between the carbon fiber and resin of the CFRP.

Further, since the CFRP layer is exposed on the side surface of the substrate, there has been a risk that electrically conductive carbon powders may fall off, adhere to between interconnections of the substrate or an insulating portion of a device, and cause a short circuit between the interconnections. In particular, when exfoliation occurs in the CFRP layer at an end portion of the substrate in a heat cycle test, falling-off of carbon powders has exerted a significant effect at an unacceptable level.

SUMMARY OF THE INVENTION

The present invention has been made in view of the above problem, and one object of the present invention is to provide a printed interconnection board with low thermal expansivity and high thermal conductivity capable of preventing exfoliation of a CFRP layer on a side surface of a substrate using CFRP as a core, as well as preventing falling-off of carbon powders from the CFRP layer, and a method of manufacturing the same.

A printed interconnection board of the present invention includes a pair of signal circuit layers, a core including carbon fiber reinforced plastic, an adhesive member, a first electrically conductive layer, and a coating layer. Each of the pair of signal circuit layers has a signal interconnection. The core including carbon fiber reinforced plastic has a primary through hole provided between the pair of signal circuit layers. The adhesive member bonds the pair of signal circuit layers and the core, coats a wall surface of the primary through hole in the core, and has a secondary through hole extending within the primary through hole. The first electrically conductive layer is formed on a wall surface of the secondary through hole for electrically connecting the signal interconnections of the pair of signal circuit layers via the secondary through hole. The coating layer coats an outer peripheral edge of the core as seen in a plan view.

A method of manufacturing a printed interconnection board of the present invention includes the steps described below.

A core including carbon fiber reinforced plastic having a first primary through hole surrounding a periphery of a product portion with a connection portion connecting the product portion and a support portion left connected, and a second primary through hole formed in the product portion is formed. An adhesive member is formed to coat both surfaces of the core and fill the first and second primary through holes. Each of a pair of signal circuit layers each having a signal interconnection is bonded to each of the both surfaces of the core with the adhesive member interposed therebetween. A first secondary through hole penetrating the adhesive member and the core to extend over the connection portion and connect end portions of the first primary through hole is formed, and a second secondary through hole penetrating the adhesive member to extend within the second primary through hole is formed. Wall surfaces of the first and second secondary through holes are coated with an electrically conductive layer. The product portion is cut out from the support portion by cutting a region of the adhesive member between the product portion and the support portion and a region of the first secondary through hole.

According to the present invention, the coating layer coats the outer peripheral edge of the core as seen in a plan view, and thus falling-off of carbon powders from the core including carbon fiber reinforced plastic can be prevented, causing no exfoliation of a carbon fiber reinforced plastic layer in a heat cycle test. Therefore, insulation reliability and heat cycle reliability can be enhanced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

First Embodiment

Figure 1:
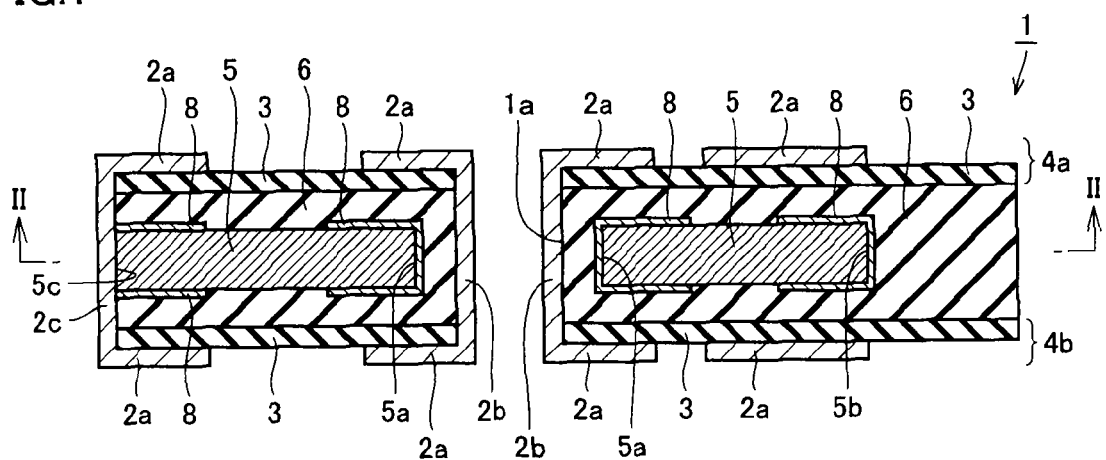
FIG. 1 is a cross sectional view schematically showing a configuration of a printed interconnection board in a first embodiment of the present invention, which is a cross sectional view taken along a line I-I of FIG. 2.
Figure 2:
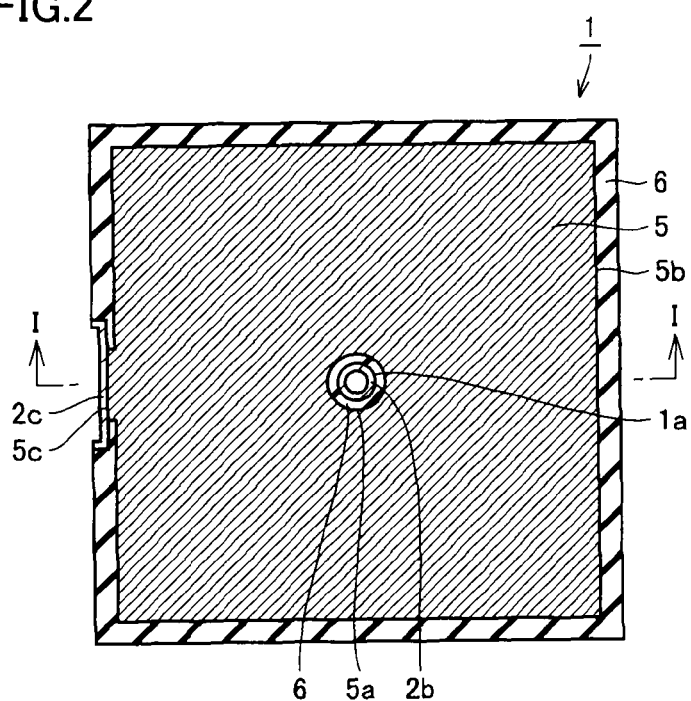
FIG. 2 is a schematic cross sectional view showing a cross section of a portion taken along a line II-II of FIG. 1 as seen in a plan view, with an electrically conductive layer 8 not illustrated.

A cross sectional portion taken along a line I-I of FIG. 2 corresponds to a cross section of FIG. 1. Further, in FIG. 2, an electrically conductive layer 8 is not illustrated for the sake of convenience of description.

Referring to FIG. 1, a printed interconnection board 1 mainly has a pair of upper and lower signal circuit layers 4a and 4b, a core including a CFRP layer 5 (hereinafter referred to as a CFRP core), an adhesive member 6, a first electrically conductive layer 2b, and coating layers 2c and 6.

Each of the pair of upper and lower signal circuit layers 4a and 4b has an insulating base material 3, and a signal interconnection 2a formed on a surface of insulating base material 3. Insulating base material 3 is, for example, a material prepared by curing a prepreg produced by impregnating glass cloth with epoxy resin or the like, and preferably has low thermal expansivity comparable to that of CFRP layer 5 to reduce stress caused by a difference in coefficients of thermal expansion of insulating base material 3 and CFRP layer 5. CFRP layer 5 has a coefficient of thermal expansion of, for example, approximately 0 ppm/° C. While insulating base material 3 generally has a coefficient of thermal expansion of approximately 16 ppm/° C., low thermal expansive insulating base material 3 has a coefficient of thermal expansion of, for example, approximately 8 to 12 ppm/° C. Signal interconnection 2a is made of, for example, copper.

The CFRP core is provided between the pair of upper and lower signal circuit layers 4a and 4b. The CFRP core has CFRP layer 5 and electrically conductive layer 8. CFRP layer 5 may be any composite material including carbon fiber and resin, and the content rate, the structure (i.e., an unidirectional material or a cross material), and the like of the carbon fiber in the composite material are not particularly limited. However, since exfoliation tends to occur in an interface between the carbon fiber and the resin in a molded board including a prepreg made of an unidirectional material as described above, it is preferable to use a cross material for CFRP layer 5. Further, CFRP layer 5 has a primary through hole 5a. Electrically conductive layer 8 is formed on a wall surface of primary through hole 5a in the CFRP core and a side surface and a portion of top and bottom surfaces of CFRP layer 5, and is made of, for example, copper.

Adhesive member 6 is formed between each of the pair of upper and lower signal circuit layers 4a and 4b and the CFRP core to bond the pair of upper and lower signal circuit layers 4a and 4b and the CFRP core. Adhesive member 6 coats the wall surface of primary through hole 5a in CFRP layer 5 with electrically conductive layer 8 interposed therebetween, and has a secondary through hole 1a extending within primary through hole 5a. Adhesive member 6 is made of, for example, an inorganic filler, resin, and glass cloth, and preferably has a thermal conductivity of 1 to 15 W/m·K. Preferably, the resin is prepared by mixing a rubber component such as CTBN (carboxy-terminated butadiene-acrylonitrile) into epoxy, bismaleimide, cyanate ester, polyimide, or the like to reduce elastic modulus. Further, examples of the inorganic filler include oxides and nitrides such as alumina, silica, magnesia, aluminum nitride, boron nitride, and silicon nitride, and a mixture thereof may be used. The reason for using filler-contained resin for adhesive member 6 is to reduce stress applied between the CFRP core and the first electrically conductive layer 2b on a side wall of secondary through hole 1a and to improve thermal conductivity.

Since secondary through hole 1a is provided within primary through hole 5a, secondary through hole 1a has a diameter smaller than that of primary through hole 5a. Secondary through hole 1a is also opened in insulating base material 3 of the pair of upper and lower signal circuit layers 4a and 4b.

The first electrically conductive layer 2b is formed on a wall surface of secondary through hole 1a to electrically connect signal interconnections 2a of the pair of upper and lower signal circuit layers 4a and 4b. The first electrically conductive layer 2b is made of, for example, copper. Further, the first electrically conductive layer 2b is electrically insulated from the CFRP core with adhesive member 6.

Coating layers 2c and 6 coat an outer peripheral edge of the CFRP core as seen in a plan view. Specifically, an outer peripheral edge 5b of the CFRP core is coated with adhesive member 6 as a coating layer, and an outer peripheral edge 5c of the CFRP core is coated with a second electrically conductive layer 2c as a coating layer. The second electrically conductive layer 2c is made of, for example, copper, and made of a material identical to that of the first electrically conductive layer 2b.

It is to be noted that solder coating (not shown) is formed on surfaces of electrically conductive layers 2a, 2b, and 2c. The solder coating is formed on a surface of the second electrically conductive layer 2c by performing solder leveling treatment (i.e., the treatment in which a substrate is dipped into a solder bath) in the final step, for example, at a temperature of 235° C. for five seconds.

Referring to FIG. 2, the entire periphery of the outer peripheral edge of the CFRP core is coated with coating layers 2c and 6. Of outer peripheral edges 5b and 5c of the CFRP core as seen in a plan view, the second electrically conductive layer 2c coats outer peripheral edge 5c not coated with adhesive member 6.

Hereinafter, a method of manufacturing the printed interconnection board in the present embodiment will be described.

Figure 3:
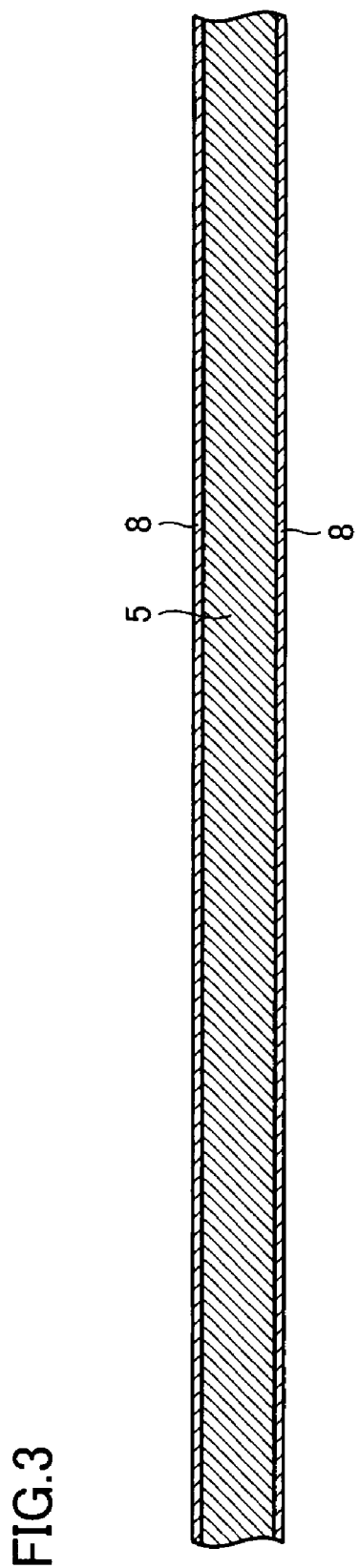
FIGS. 3 to 12 are schematic cross sectional views showing a method of manufacturing the printed interconnection board in the first embodiment of the present invention in the order of steps.

Referring to FIG. 3, the CFRP core having electrically conductive layer 8 made of, for example, copper bonded to the both surfaces of CFRP layer 5 is prepared.

Figure 4:
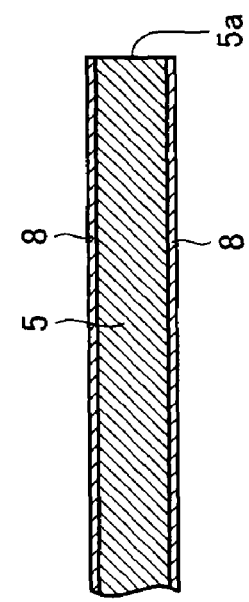
Figure 4:
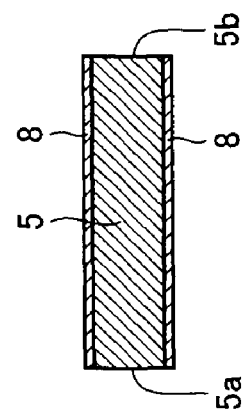
Figure 4:
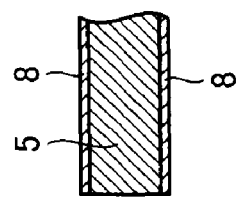
Figure 13:
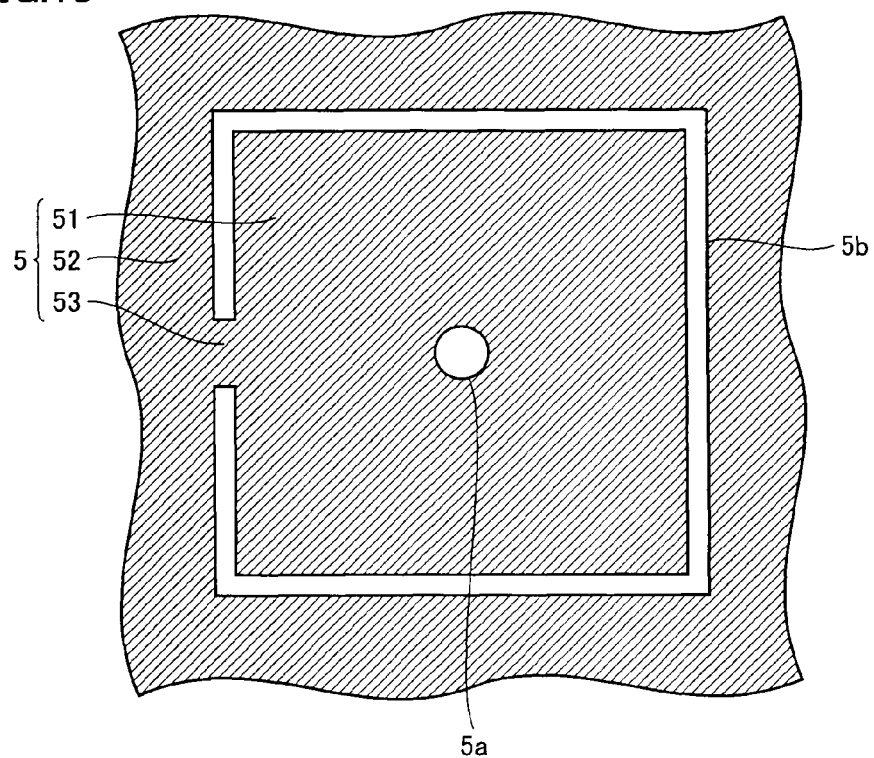
FIGS. 13 to 17 are schematic cross sectional views showing the method of manufacturing the printed interconnection board in the first embodiment of the present invention in the order of steps, in a cross section identical to that of FIG. 2.

Referring to FIGS. 4 and 13, primary through holes 5a and 5b are formed in the CFRP core in a single step. Primary through hole 5b is formed, for example, to surround the periphery of a product portion 51 of the CFRP core with a connection portion 53 connecting product portion 51 and a support portion 52 left connected, as seen in a plan view. Primary through hole 5a is formed in product portion 51.

Although FIG. 13 shows that one primary through hole 5b and one connection portion 53 are formed, primary through hole 5b may be formed to be separated into plural holes to surround the periphery of product portion 51. In this case, a plurality of connection portions 53 are also required. Further, although FIG. 13 shows that one primary through hole 5a is formed in product portion 51, a plurality of primary through holes 5a may be formed in product portion 51.

Figure 5:
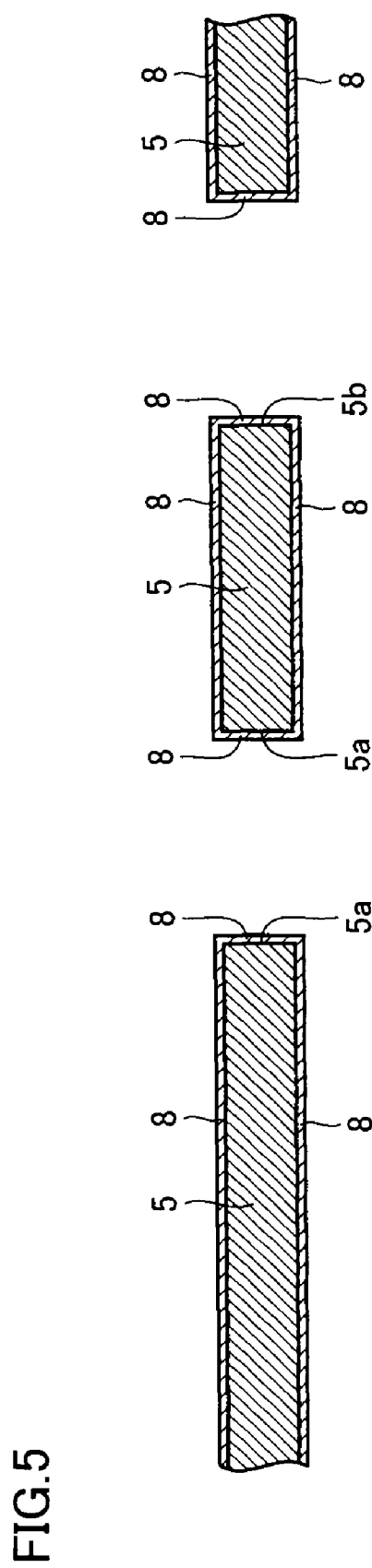

Referring to FIG. 5, copper plating is performed on the CFRP core. Thereby, the wall surface of each of primary through holes 5a and 5b is coated with electrically conductive layer 8 made by copper plating, preventing carbon powders from falling off.

Figure 6:
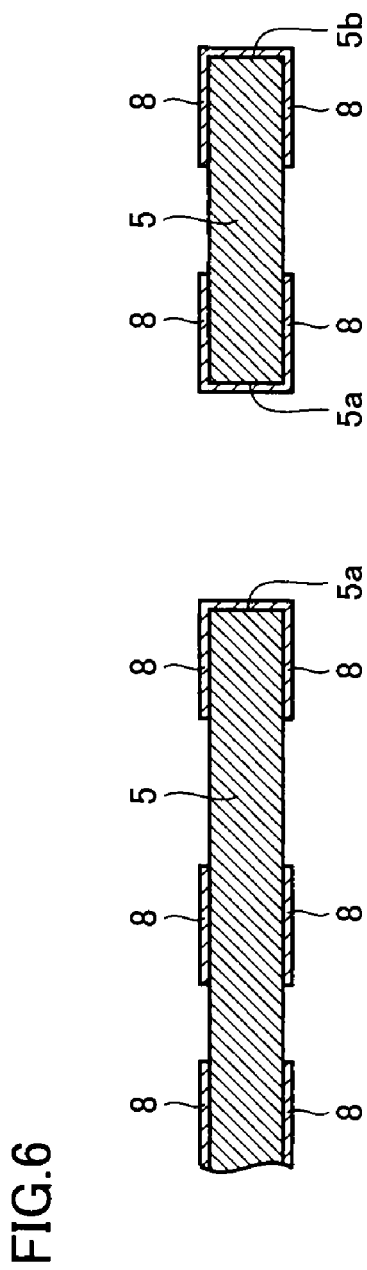

Referring to FIG. 6, electrically conductive layer 8 is patterned, and an unnecessary portion of electrically conductive layer 8 is removed.

Figure 7:
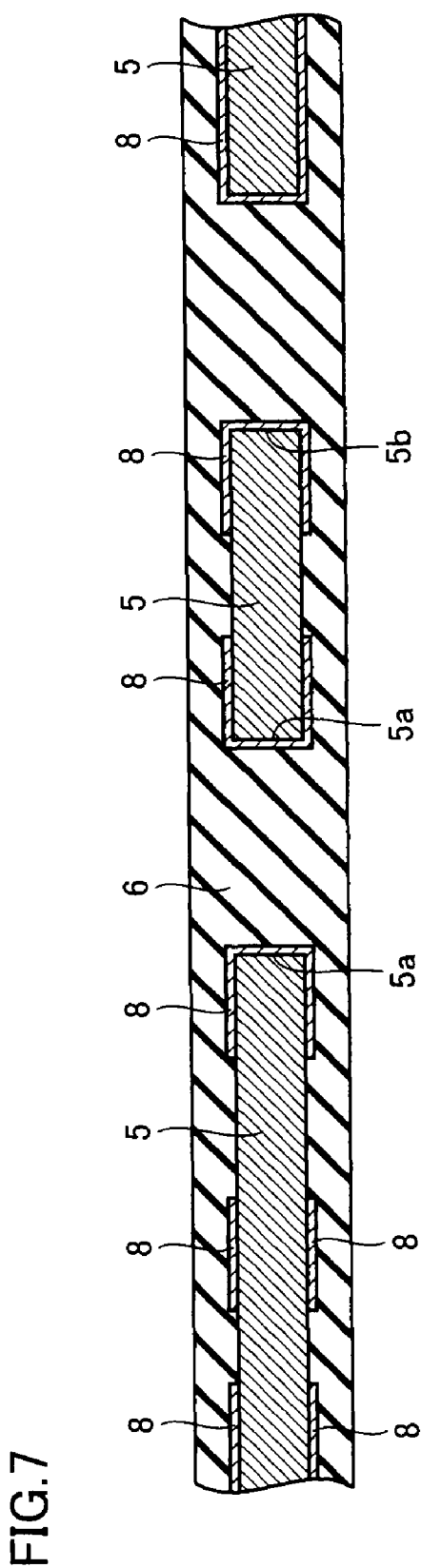
Figure 14:
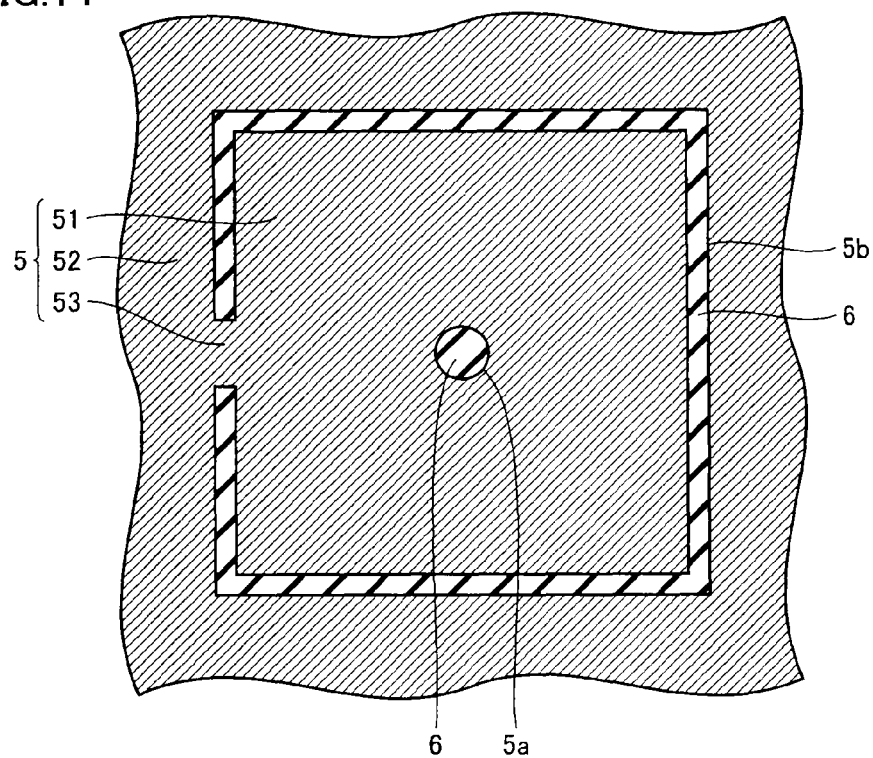

Referring to FIGS. 7 and 14, adhesive member 6 made of, for example, a semi-cured inorganic filler-contained resin sheet is prepared and bonded to both of top and bottom surfaces of the CFRP core by vacuum lamination. On this occasion, primary through holes 5a and 5b are filled with adhesive member 6.

Figure 8:
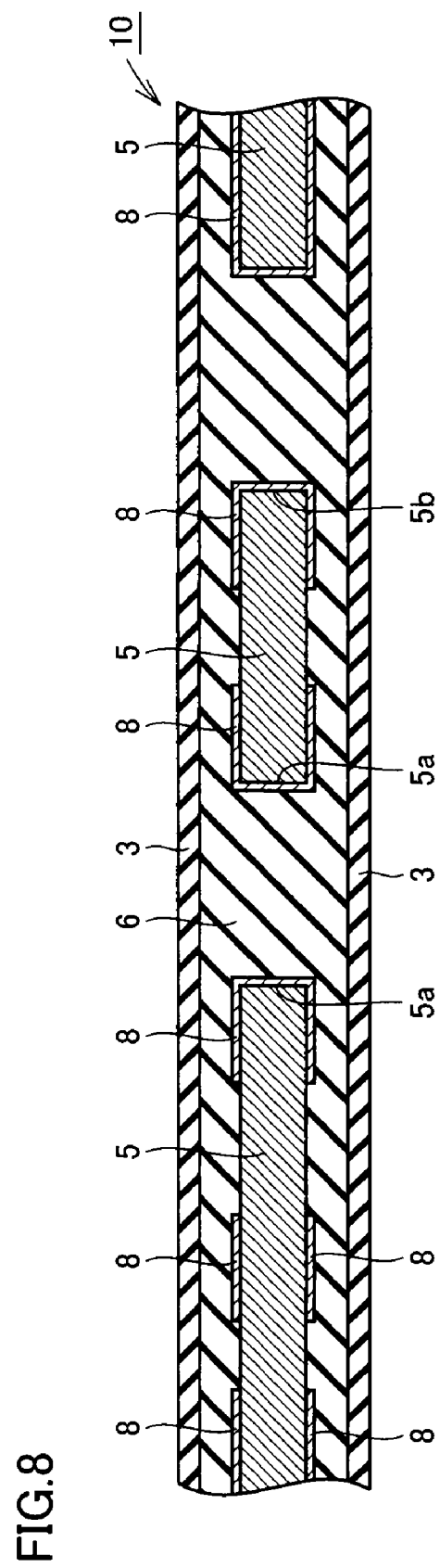

Referring to FIG. 8, insulating base material 3 made of, for example, an uncured insulating prepreg is bonded to the both surfaces of the CFRP core with adhesive member 6 interposed therebetween.

Figure 9:
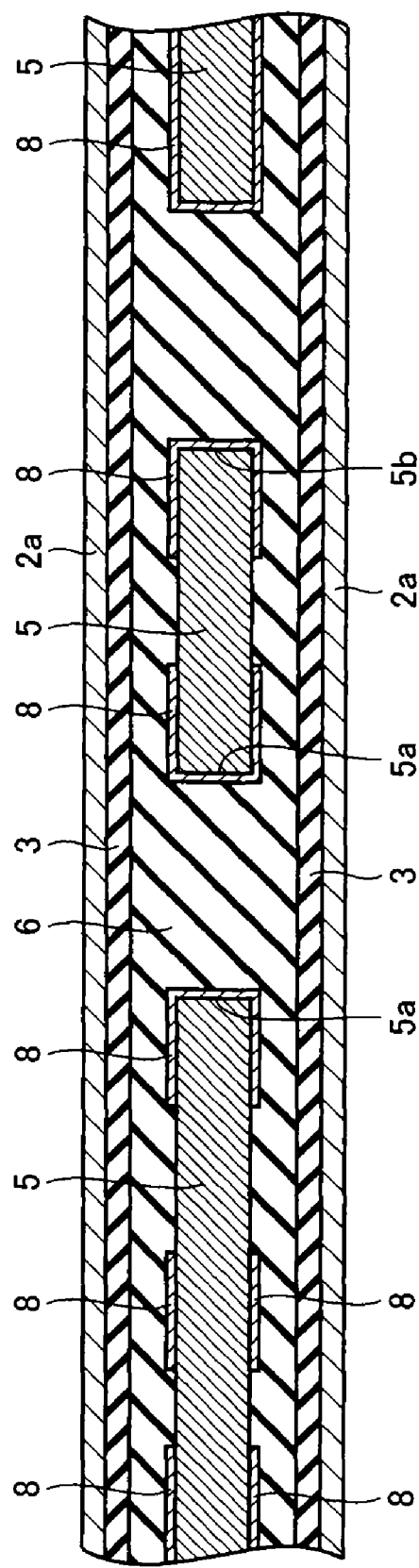

Referring to FIG. 9, electrically conductive layer 2a made of, for example, copper foil is bonded to the surface of insulating base material 3, and heat and pressure are applied under prescribed conditions, using vacuum pressing.

Figure 10:
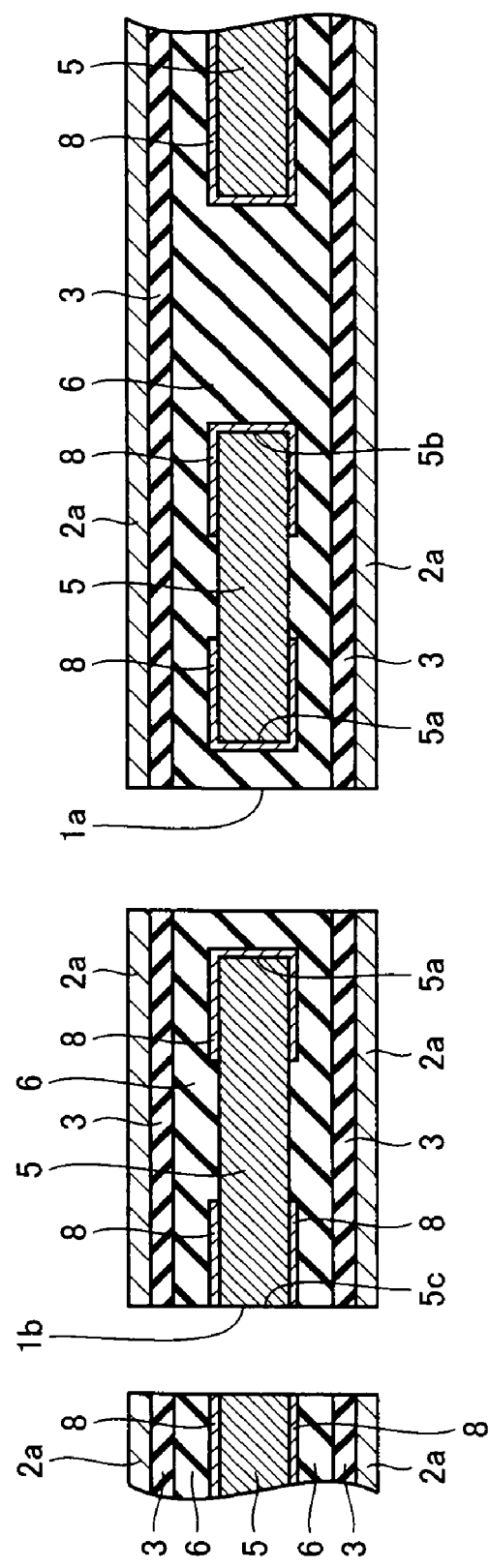
Figure 15:
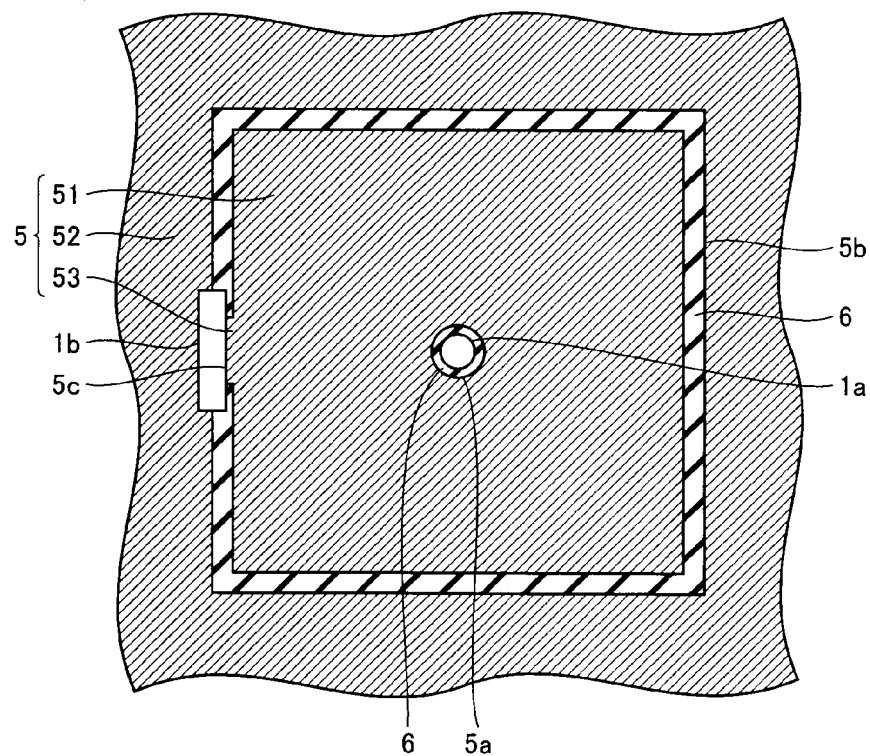

Referring to FIGS. 10 and 15, secondary through holes 1a and 1b are formed in a single step. Secondary through hole 1a is formed coaxially with primary through hole 5a to extend within primary through hole 5a, penetrating each of electrically conductive layer 2a, insulating base material 3, and adhesive member 6. Secondary through hole 1b is formed to extend over connection portion 53 to connect end portions of primary through hole 5b, penetrating each of electrically conductive layer 2a, insulating base material 3, adhesive member 6, and the CFRP core. CFRP layer 5 is exposed on a wall surface of secondary through hole 1b.

Figure 11:
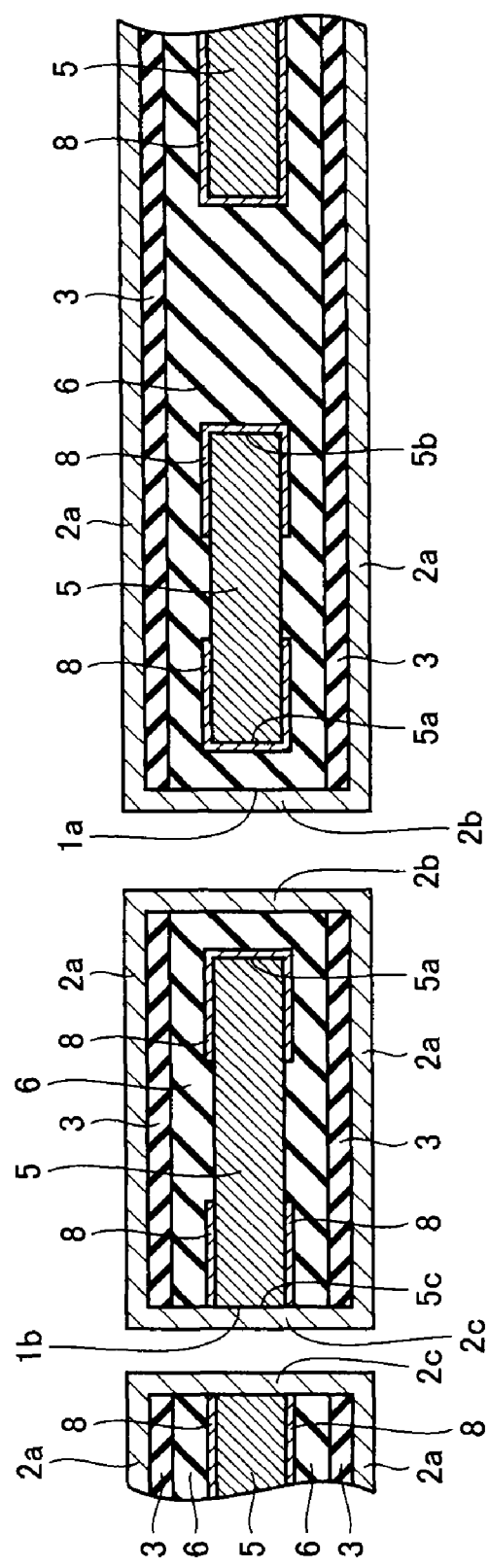
Figure 16:
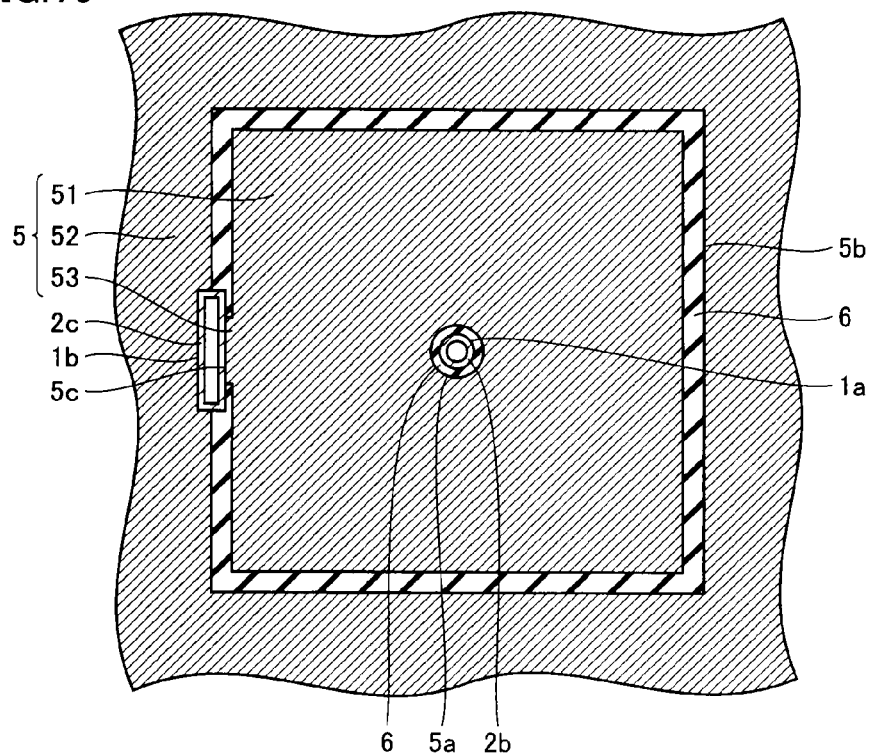

Referring to FIGS. 11 and 16, copper plating is performed, and thus electrically conductive layer 2b made by copper plating is formed all over the wall surface of secondary through hole 1a, and electrically conductive layer 2c made by copper plating is formed all over the wall surface of secondary through hole 1b. Thereby, electrically conductive layers 2a formed on both of the top and bottom surfaces of the CFRP core are electrically connected by electrically conductive layers 2b and 2c, and CFRP layer 5 exposed on the wall surface of secondary through hole 1b is coated with electrically conductive layer 2c.

Figure 12:
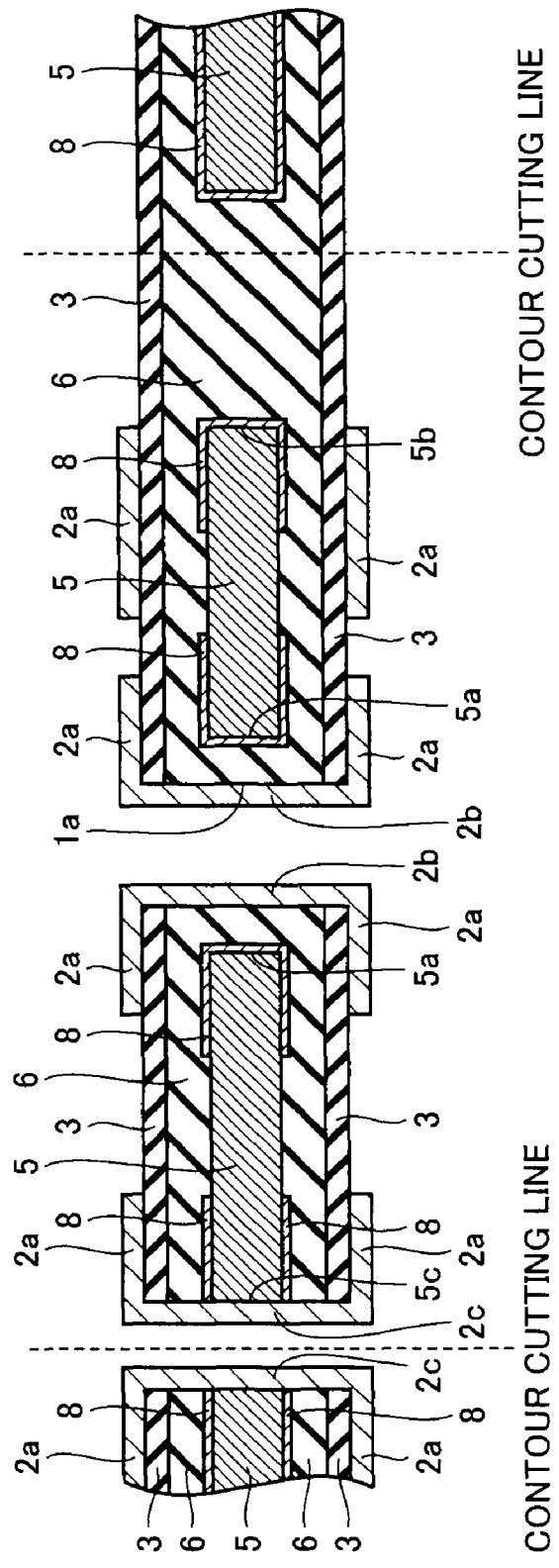
Figure 17:
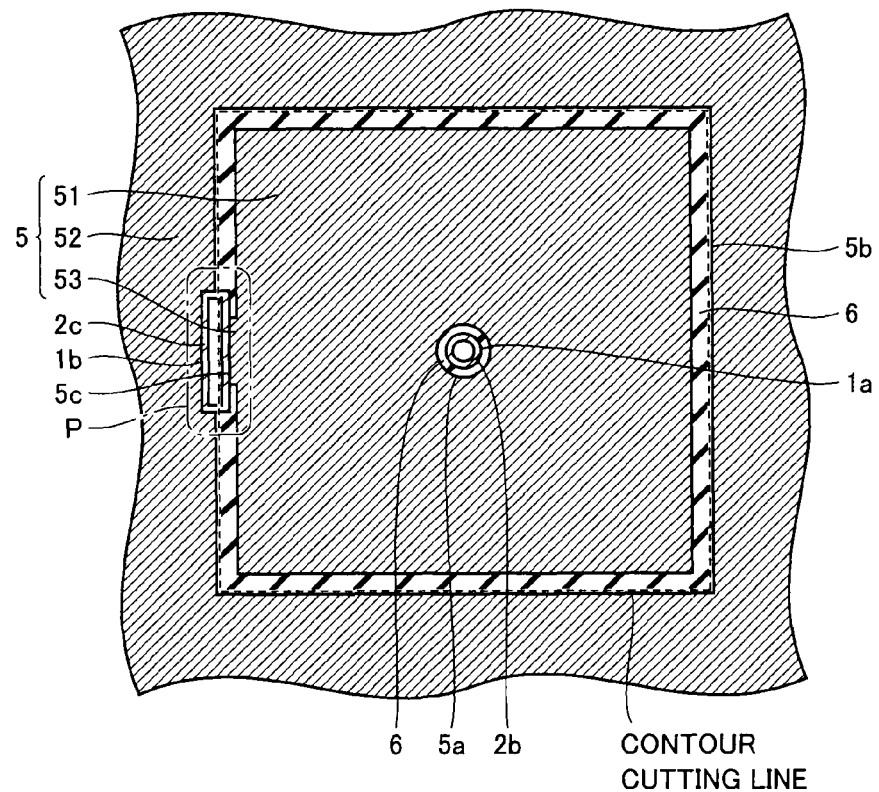

Referring to FIGS. 12 and 17, electrically conductive layer 2a is patterned, and thereby signal interconnection 2a having a prescribed pattern shape is formed from electrically conductive layer 2a. Thereafter, solder resist coating and solder coating by gas leveling treatment are performed, and then contour cutting is performed. The contour cutting is performed by cutting a region of adhesive member 6 between product portion 51 and support portion 52 (i.e., adhesive member 6 within primary through hole 5b) and a region of secondary through hole 1b with a router as shown by a contour cutting line indicated by a broken line in the drawing, to cut out product portion 51. Thereby, product portion 51 is cut out from support portion 52, and printed interconnection board 1 of the present embodiment shown in FIGS. 1 and 2 is manufactured.

According to printed interconnection board 1 of the present embodiment, outer peripheral edges 5b and 5c of the CFRP core are coated with the coating layers (the second electrically conductive layer 2c, adhesive member 6) as shown in FIGS. 1 and 2, eliminating falling-off of carbon powders from CFRP layer 5 and exfoliation of CFRP layer 5 in a heat cycle test.

The reason why the entire periphery of outer peripheral edges 5b and 5c of the CFRP core cannot be coated with adhesive member 6 is that a size during manufacturing a substrate (i.e., a work size) is larger than a size of a product shown in FIGS. 1 and 2. The reason why the work size is larger than the size of a product is that it is necessary to provide an element that is required during manufacturing but is not left in a product, such as a positioning hole, in an outer peripheral portion of a piece of work (i.e., in a portion outside product portion 51).

Since the work size is larger than the size of a product as described above, it is necessary to cut out product portion 51 from support portion 52 in the periphery thereof as shown in FIG. 17. If it is assumed that primary through hole 5b continuously surrounds the entire periphery of product portion 51, product portion 51 is completely separated from support portion 52 and drops off from a piece of work during manufacturing, and as a result, it becomes difficult to manufacture printed interconnection board 1 in an ordinary substrate manufacturing facility.

Therefore, it is necessary to leave connection portion 53 for connecting product portion 51 and support portion 52 in some part. However, when connection portion 53 is left, it becomes necessary to cut the CFRP core at connection portion 53 and the like when product portion 51 is cut out from support portion 52. Since a cut surface of the CFRP core at connection portion 53 and the like is not coated with adhesive member 6, the entire periphery of the outer peripheral edge of the CFRP core cannot be coated with adhesive member 6.

In the manufacturing method of the present embodiment, primary through hole 5b is formed to surround product portion 51 with connection portion 53 left connected as shown in FIG. 13, and thereby product portion 51 is prevented from dropping off from a piece of work during manufacturing. Further, primary through hole 5b is filled with adhesive member 6 as shown in FIG. 14, and thereby outer peripheral edge 5b of the CFRP core can be coated with adhesive member 6.

Furthermore, since secondary through hole 1b is formed to extend over connection portion 53 with primary through hole 5b filled with adhesive member 6 as shown in FIG. 15, product portion 51 is prevented from dropping off from a piece of work even if secondary through hole 1b is formed to connect the end portions of primary through hole 5b.

Furthermore, since electrically conductive layers 2b and 2c are formed on the wall surfaces of secondary through holes 1a and 1b, respectively, in a single step as shown in FIG. 16, there is no need to form electrically conductive layer 2c as a coating layer in a step separate from the step of forming electrically conductive layer 2b, thereby simplifying the manufacturing process. Further, since electrically conductive layer 2c as a coating layer is formed on the wall surface of secondary through hole 1b, outer peripheral edge 5c of CFRP layer 5 exposed on the wall surface of secondary through hole 1b can be coated with electrically conductive layer 2c. This can prevent falling-off of carbon powders from CFRP layer 5 and exfoliation of CFRP layer 5 in a heat cycle test.

Furthermore, exposure of electrically conductive layer 2c can be prevented by forming a cut hole prior to the solder coating by gas leveling treatment described above performed in the step shown in FIG. 17. Hereinafter, a description thereof will be given.

Figure 18:
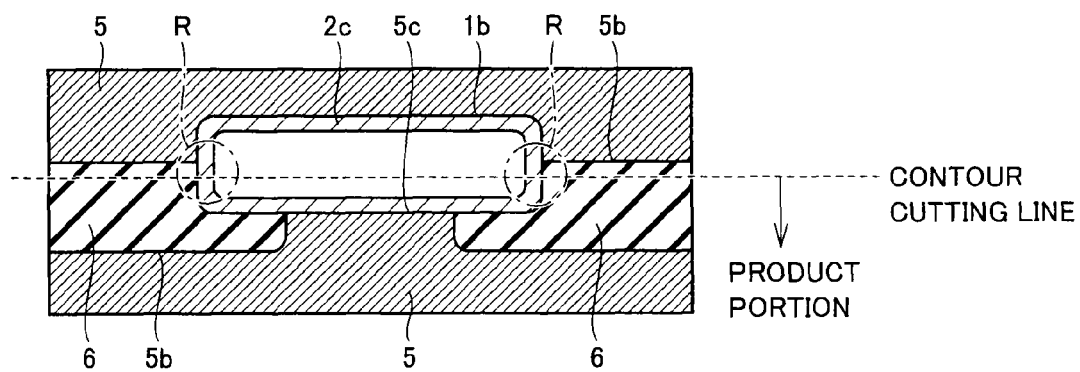
FIG. 18 is an enlarged view of a region P of FIG. 17.
Figure 19:
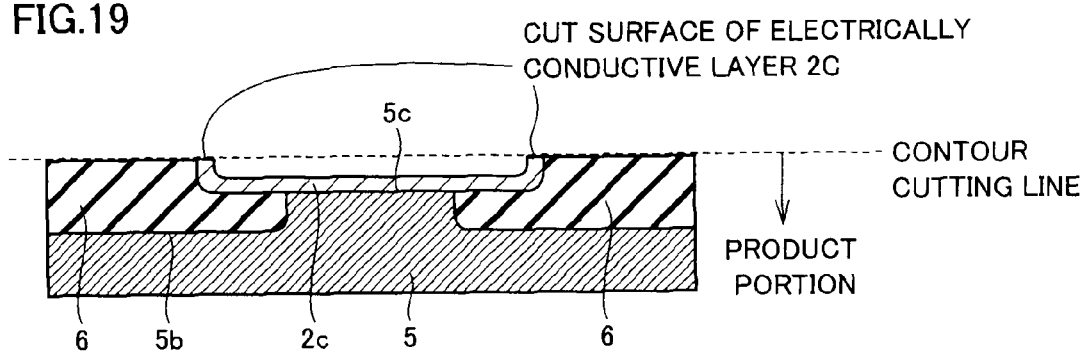
FIG. 19 is a view for illustrating that an electrically conductive layer 2c is exposed when a cut hole is not formed prior to solder coating by gas leveling treatment.

Referring to FIG. 18, when the solder coating by gas leveling treatment is performed, the surfaces of electrically conductive layers 2a, 2b, and 2c are coated with solder. Therefore, immediately after the solder coating, the surfaces of electrically conductive layers 2a, 2b, and 2c are not exposed. Thereafter, however, when cutting is performed along the contour cutting line indicated by a broken line in the drawing, copper is exposed to the outside at a cut surface of electrically conductive layer 2c as shown in FIG. 19.

Figure 20:
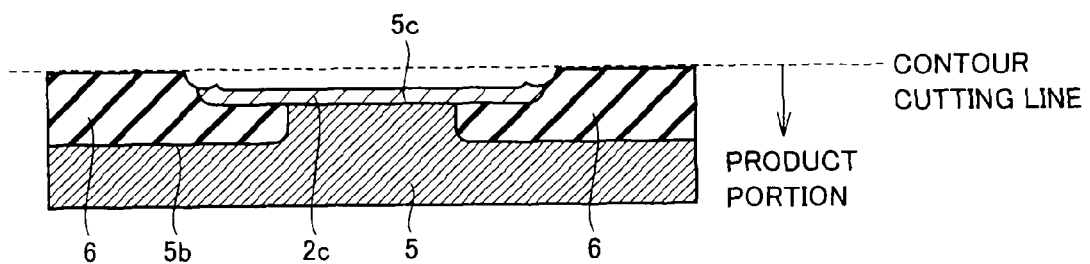
FIG. 20 is a view for illustrating that electrically conductive layer 2c is not exposed when a cut hole is formed prior to solder coating by gas leveling treatment.

In contrast, when the solder coating by gas leveling treatment is performed after a cut hole is formed at a region R shown in FIG. 18, copper of electrically conductive layer 2c is not exposed to the outside as shown in FIG. 20 even after cutting is performed along the contour cutting line. Therefore, exposure of electrically conductive layer 2c can be prevented by forming a cut hole prior to the solder coating by gas leveling treatment as described above, and electrically conductive layer 2c can be subjected to rust-proof treatment by soldering.

Further, top and bottom patterns may be connected by copper plating and a through hole for short-circuiting the top and bottom patterns may be provided to further improve heat dissipation property and reinforcement of the side surface of printed interconnection board 1. Hereinafter, a configuration thereof will be described.

Figure 23:
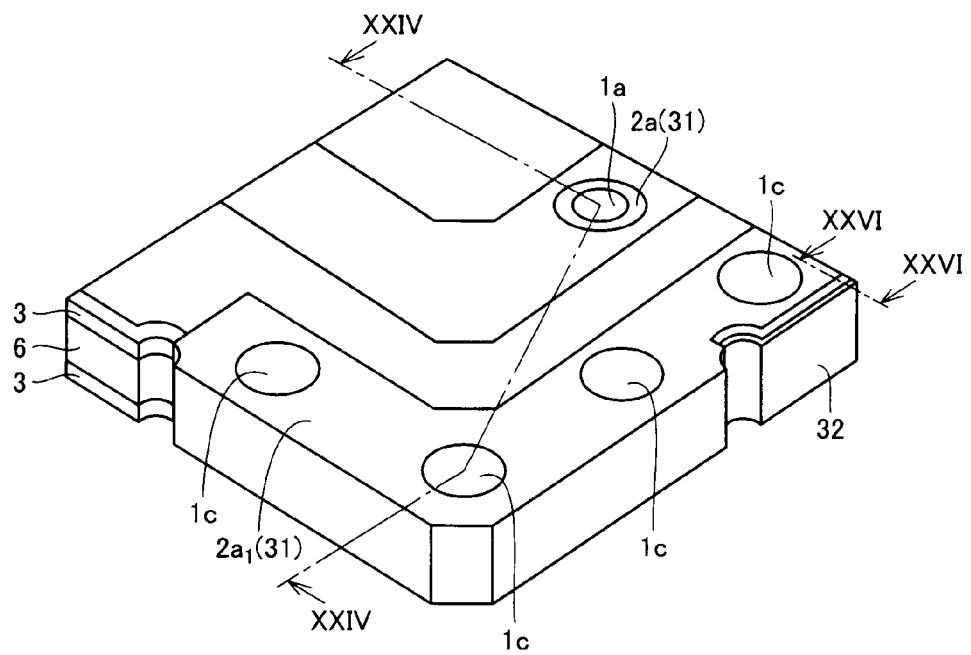
FIG. 23 is a perspective view schematically showing the configuration of the printed interconnection board in the first embodiment of the present invention.
Figure 24:
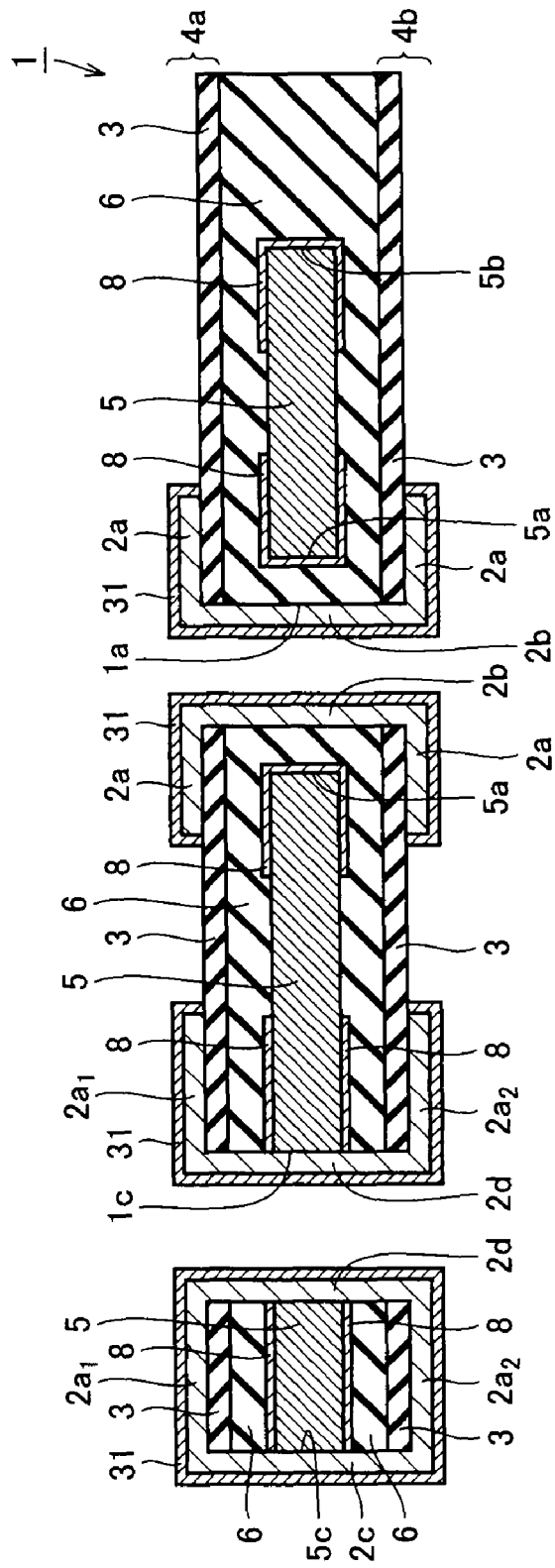
FIG. 24 is a schematic cross sectional view taken along a line XXIV-XXIV of FIG. 23.

Referring to FIGS. 23 and 24, in the vicinity of the outer peripheral edge of printed interconnection board 1, a top surface side electrically conductive pattern $2a_1$ is formed on a top surface side of CFRP core 5 with adhesive member 6 and insulating base material 3 interposed therebetween, and a bottom surface side electrically conductive pattern $2a_2$ is formed on a bottom surface side of CFRP core 5 with adhesive member 6 and insulating base material 3 interposed therebetween. Top surface side electrically conductive pattern $2a_1$ and bottom surface side electrically conductive pattern $2a_2$ are each made of an electrically conductive material formed for example by copper plating.

Outer peripheral edge 5c of CFRP core 5 is coated with the second electrically conductive layer 2c as a coating layer, and top surface side electrically conductive pattern $2a_1$ and bottom surface side electrically conductive pattern $2a_2$ are electrically connected by the second electrically conductive layer 2c. The second electrically conductive layer 2c is made of an electrically conductive material formed for example by copper plating. The second electrically conductive layer 2c is in contact with CFRP core 5, and is electrically short-circuited with CFRP core 5.

Further, a short-circuited through hole 1c penetrating top surface side electrically conductive pattern $2a_1$, bottom surface side electrically conductive pattern $2a_2$, insulating base material 3, CFRP core 5, adhesive member 6, and the like is formed. A third electrically conductive layer 2d is formed on a wall surface of short-circuited through hole 1c to coat an exposed surface of CFRP core 5. The third electrically conductive layer 2d is made of an electrically conductive material formed for example by copper plating. The third electrically conductive layer 2d is in contact with CFRP core 5, and is electrically short-circuited with CFRP core 5.

Since the second electrically conductive layer 2c and the third electrically conductive layer 2d are formed to be in contact with CFRP core 5, and each of the second electrically conductive layer 2c and the third electrically conductive layer 2d is in contact with both of top surface side electrically conductive pattern $2a_1$ and bottom surface side electrically conductive pattern $2a_2$, heat dissipation property and reinforcement of the side surface of printed interconnection board 1 can be further improved.

As shown in FIG. 24, the surfaces of electrically conductive layers 2a to 2d, $2a_1$, and $2a_2$ are each coated with solder, and solder 31 is formed on each surface. Further, in FIG. 24, elements corresponding to those of FIG. 1 are indicated by reference numerals identical to those shown in FIG. 1.

Figure 25:
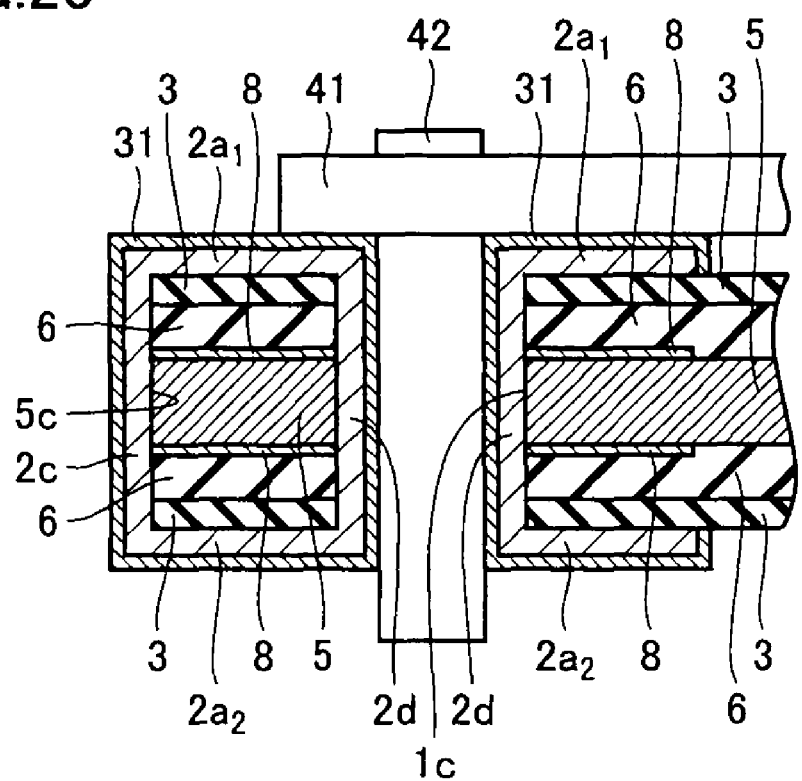
FIG. 25 is a partial cross sectional view schematically showing a state where a printed interconnection board is attached to a casing by inserting a screw into a short-circuited through hole.

Further, since through hole 1c described above is provided, printed interconnection board 1 can be attached to a casing 41 by inserting a screw 42 into through hole 1c as shown in FIG. 25. Thereby, either one of top surface side electrically conductive pattern $2a_1$ and bottom surface side electrically conductive pattern $2a_2$ can be connected to casing 41 with solder 31 interposed therebetween, and thus heat dissipation from printed interconnection board 1 to casing 41 can be enhanced.

Figure 26:
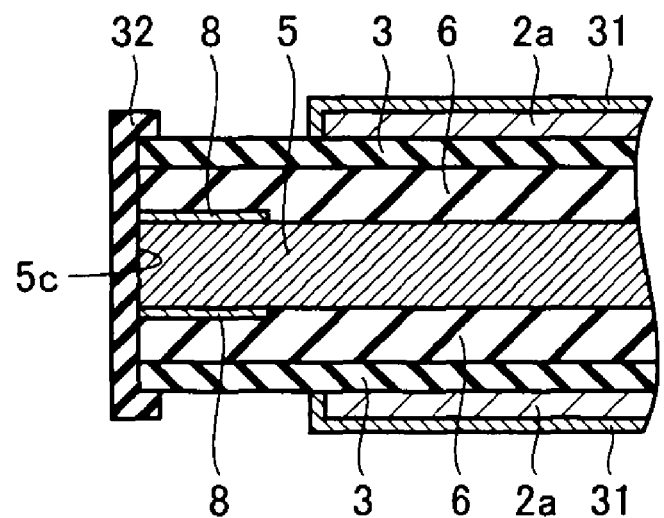
FIG. 26 is a schematic cross sectional view taken along a line XXVI-XXVI of FIG. 23.

If the outer peripheral edge of CFRP core 5 has a portion that cannot be coated with the second electrically conductive layer 2c or adhesive member 6 due to a size-related problem, the outer peripheral edge of CFRP core 5 may be coated with a resin layer 32 at the portion as shown in FIG. 26. Although resin layer 32 merely has to coat only an exposed portion of CFRP core 5, applying resin layer 32 only to the portion is difficult due to manufacturing reasons, and thus resin layer 32 is applied all over the side surface of printed interconnection board 1.

Resin layer 32 is made of, for example, epoxy resin, and is applied in the final step of the method of manufacturing printed interconnection board 1. The material for resin layer 32 is not limited to epoxy resin. Since the material is required to have adhesiveness, thermal resistance, and the like, it is preferably a thermosetting resin used for a substrate material, such as polyimide resin, bismaleimide triazine resin, polyphenylene oxide resin, polyphenylene ether resin, or the like.

Since the outer peripheral edge of CFRP core 5 that cannot be coated with the second electrically conductive layer 2c and adhesive member 6 due to a size-related problem can be coated with resin layer 32 as described above, falling-off of carbon powders from CFRP core 5 can be prevented.

It is to be noted that, in FIG. 26, elements corresponding to those of FIG. 1 are indicated by reference numerals identical to those shown in FIG. 1.

Second Embodiment

Figure 21:
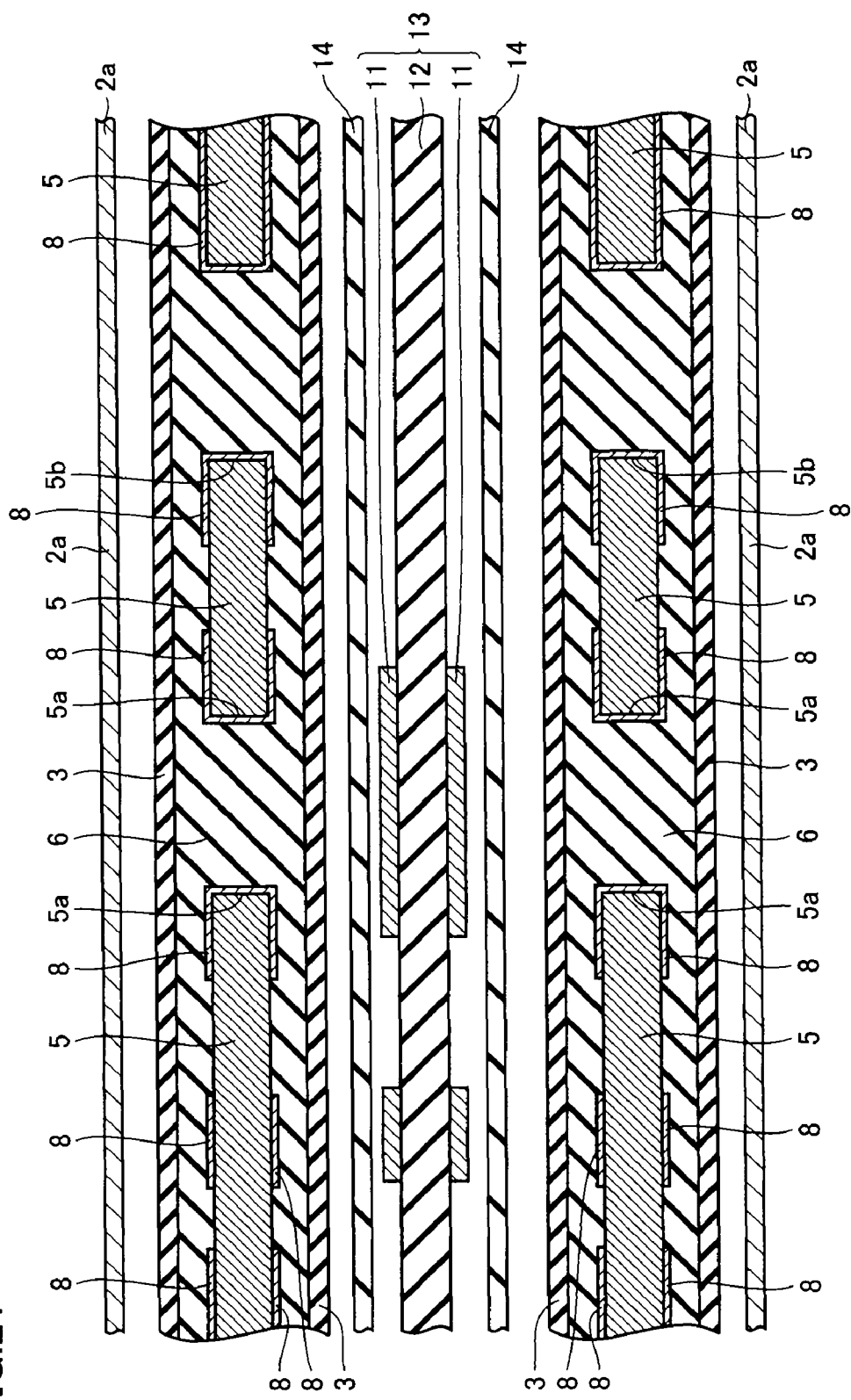
FIG. 21 is a schematic cross sectional view showing a method of manufacturing a printed interconnection board in a second embodiment of the present invention.

In the first embodiment, the description has been given of a case where a laminated board 10 shown in FIG. 8 is formed, and thereafter copper foil 2a is placed and laminated above and below the laminated board as shown in FIG. 9. In contrast, in the present embodiment, a four-layered printed interconnection board is manufactured using laminated board 10 shown in FIG. 8. Hereinafter, a description thereof will be given. Referring to FIG. 21, two laminated boards 10 shown in FIG. 8 are prepared. An internal layer signal circuit layer 13 is arranged between these two laminated boards 10 with glass epoxy prepregs 14 interposed between internal layer signal circuit layer 13 and laminated boards 10, and electrically conductive layers 2a made of, for example, copper foil are arranged on the two laminated boards 10 on sides opposite to internal layer signal circuit layer 13. With this arrangement, heat and pressure are applied using, for example, vacuum pressing. Thereafter, manufacturing steps identical to those in the first embodiment shown in FIGS. 10-12 and 15-17 are performed, and as a result, a four-layered board as shown in FIG. 22 can be obtained.

In the above description, internal layer signal circuit layer 13 has an insulating base material 12, and a signal interconnection 11 formed on a surface of insulating base material 12. Insulating base material 12 is made of, for example, a material prepared by curing a prepreg produced by impregnating glass cloth with epoxy resin or the like. Signal interconnection 2a is made of, for example, copper.

Figure 22:
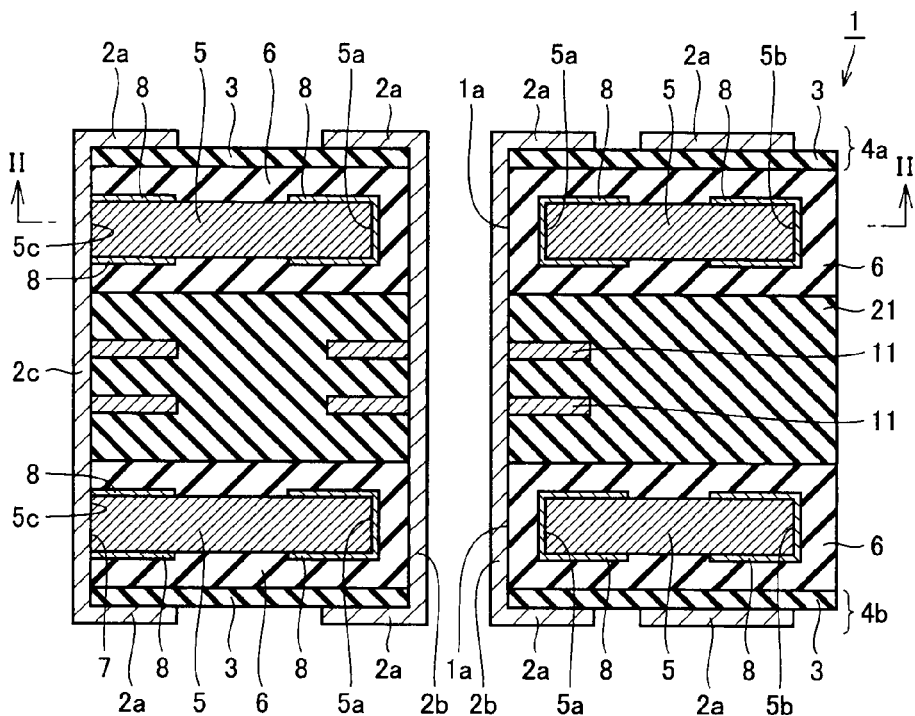
FIG. 22 is a cross sectional view schematically showing a configuration of the printed interconnection board in the second embodiment of the present invention.

Referring to FIG. 22, in a four-layered board configuration obtained as described above, a plurality of (for example, two) patterned signal interconnections 11 are formed between upper and lower adhesive members 6. Each of the plurality of patterned signal interconnections 11 is electrically insulated from other signal interconnections with an insulating layer 21 such as glass epoxy.

Further, in the four-layered board configuration of the present embodiment, coating layers 2c and 6 coat outer peripheral edges 5b and 5c of the CFRP core as seen in a plan view, as in the configuration of the first embodiment shown in FIG. 1. Specifically, outer peripheral edge 5b of the CFRP core is coated with adhesive member 6 as a coating layer, and outer peripheral edge 5c of the CFRP core is coated with the second electrically conductive layer 2c as a coating layer. The second electrically conductive layer 2c is made of, for example, copper, and made of a material identical to that of the first electrically conductive layer 2b.

Further, the configuration of a cross section taken along a line II-II of FIG. 22 is substantially identical to the configuration of FIG. 2. Specifically, referring to FIG. 2, the entire periphery of the outer peripheral edge of the CFRP core is coated with coating layers 2c and 6. Of outer peripheral edges 5b and 5c of the CFRP core as seen in a plan view, the second electrically conductive layer 2c coats outer peripheral edge 5c not coated with adhesive member 6.

As for the rest, the configuration of the present embodiment is substantially identical to the configuration of the first embodiment, and thus identical elements are indicated by the same reference numerals and the description thereof will not be repeated.

Also in the present embodiment, the function and effect identical to those of the first embodiment can be obtained.

Hereinafter, examples will be described to provide more detailed description.

FIRST EXAMPLE

Firstly, a CFRP core (thickness: 0.35 mm, size: 340 mm×250 mm) having prepreg 5 (CFRP layer 5) including carbon fiber (a cross material) with a thermal conductivity of 500 W/m·K, and 18 μm-thick copper foil 8 laminated on prepreg 5 was prepared (see FIG. 3).

Next, holes were drilled in the CFRP core to provide primary through hole 5a with a diameter of 1.5 mm and primary through hole 5b as an elongated hole with a width of 4 mm (see FIG. 4). On this occasion, carbon powders were dispersed from the wall surfaces of primary through holes 5a and 5b. Subsequently, copper plating was performed (see FIG. 5). Thereby, copper plating 8 was formed on the both wall surfaces of primary through holes 5a and 5b, preventing dispersion of carbon powders from the wall surfaces.

Next, an unnecessary portion of copper 8 was removed by patterning (see FIG. 6). Thereby, copper was removed from the surface of CFRP layer 5, and the surface of CFRP layer 5 was exposed. However, on the surface of CFRP layer 5 exposed from copper 8, resin of the CFRP prepreg constituting CFRP layer 5 was exposed, and the carbon fiber of the CFRP prepreg was not exposed, and thus carbon powders were not dispersed. Further, the purpose of removing an unnecessary portion of copper 8 is to reduce stress and weight. CFRP layer 5 has a low coefficient of thermal expansion of ±2 ppm/° C., and if copper 8 (coefficient of thermal expansion: 16 ppm/° C.) is provided all over the surface of CFRP layer 5, stress due to a difference in the coefficients of thermal expansion is caused, and exfoliation may occur in an interface between CFRP layer 5 and copper 8 during a heat cycle test of a product.

Next, semi-cured highly thermally conductive resin sheet 6 (thickness: 120 μm) having mold releasing films attached on top and bottom surfaces thereof was prepared. The highly thermally conductive resin is made of epoxy resin produced by mixing an alumina filler and CTBN. After being cured, the highly thermally conductive resin has a thermal conductivity of 3 W/m·K, an elastic modulus of 19 GPa, and a coefficient of thermal expansion of 27 ppm/° C., and thus the resin has a coefficient of thermal expansion of and an elastic modulus lower than those of an ordinary resin.

Next, with the mold releasing film on one surface peeled off, highly thermally conductive resin sheet 6 was vacuum laminated using a stainless smoothing plate (see FIG. 7). After the lamination, the mold releasing film on the top surface was peeled off.

This step was repeated twice to bond 240 μm-thick highly thermally conductive resin sheet 6 to each of the top and bottom surfaces of the CFRP core. On this occasion, primary through holes 5a and 5b were filled with highly thermally conductive resin sheet 6 as much as possible. The vacuum lamination was performed by vacuuming for one minute at 150° C., and then applying a pressure of 10 kg/cm² for two minutes.

Next, glass epoxy prepreg 3 of 60 μm was prepared. As prepreg 3, a prepreg named GEA-679N (LD) manufactured by Hitachi Chemical Co., Ltd., having a coefficient of thermal expansion of 8 to 12 ppm/° C. lower than that of an ordinary prepreg was used.

Prepregs 3 were vacuum laminated on the top and bottom surfaces of highly thermally conductive resin sheet 6 (see FIG. 8). The vacuum lamination was performed by vacuuming for 30 seconds at 100° C., and then applying a pressure of 10 kg/cm² for 30 seconds.

Next, with 18 μm thick copper foil 2a bonded, heat and pressure were applied using vacuum pressing under the conditions of a temperature increasing rate of 5° C./minute, a holding time of one hour at 190° C., and a lamination pressure of 30 kg/cm² to obtain a laminated board (see FIG. 9).

Next, secondary through hole 1a with a diameter of 0.9 mm was provided coaxially with primary through hole 5a with a diameter of 1.5 mm (see FIG. 10). On this occasion, through hole 1b as an elongated hole with a width of 4 mm was formed to overlap elongated hole 5b provided in the CFRP core as shown in FIG. 15 (see FIG. 10). Further, on this occasion, short-circuited through hole 1c with a diameter of 5 mm was formed as shown in FIG. 24.

Next, copper plating was performed to form copper layers 2b, 2c, and 2d on the wall surfaces of secondary through hole 1a, through hole 1b, and short-circuited through hole 1c, respectively (see FIGS. 11 and 24). Then, a through hole with a diameter of 3 mm was formed as a cut hole at region R shown in FIG. 18. Subsequently, patterning was performed on copper foil 2a (see FIGS. 12 and 24). By the patterning, copper foil 2a was left to be connected to copper layers 2b and 2c. Further, as shown in FIG. 24, copper foil $2a_1$ and copper foil $2a_2$ were left such that a short circuit was caused between top surface side electrically conductive pattern $2a_1$, and bottom surface side electrically conductive pattern $2a_2$ by copper layer 2d on the wall surface of short-circuited through hole 1c.

Next, solder resist coating and solder coating by gas leveling treatment were performed, and thereafter, contour cutting was performed along the contour cutting lines indicated in FIGS. 12 and 17. Thereby, printed interconnection board I as shown in FIGS. 1 and 2 was obtained.

For the obtained CFRP core substrate, insulation resistance between the CFRP core and electrically conductive layer 2b was examined. It was found that the insulation resistance when 1000 V was applied was not less than 5 GΩ in both of before and after applying radiation, and did not present any problem. Further, when a heat cycle test (−65° C. for 15 minutes ↔125° C. for 15 minutes, 500 cycles) was conducted, no short circuit, break, or the like occurred, and no exfoliation or the like was found on the side surface of the substrate. Furthermore, when a large-sized ceramic component (approximately 10 mm×approximately 20 mm×approximately 4 mm) was mounted on the CFRP core substrate described above and a heat cycle test (−30° C. for 15 minutes ↔100° C. for 15 minutes, 500 cycles) was conducted, no crack occurred in a solder joint portion.

As shown in FIG. 25, printed interconnection board 1 was attached to casing 41 by inserting screw 42 into short-circuited through hole 1c. Thereby, either one of top surface side electrically conductive pattern $2a_1$ and bottom surface side electrically conductive pattern $2a_2$ was connected to casing 41 with solder 31 interposed therebetween.

SECOND EXAMPLE

As in the first example, primary through hole 5a was provided in the CFRP core, copper plating was performed, and then patterning was performed. Subsequently, highly thermally conductive resin and low thermal expansive glass epoxy were sequentially bonded by vacuum lamination to obtain laminated board 10 as shown in FIG. 8.

Next, a low thermal expansive double-face copper-clad glass epoxy board (MCL-E-679(LD), t0.2 mm-18/18 μm) was prepared, and patterning was performed on the copper of the copper-clad board.

Laminated board 10 described above, the low thermal expansive double-face copper-clad glass epoxy board having a patterned copper layer, and 18 μm-thick copper foil 2a were arranged as shown in FIG. 21, and heat and pressure were applied using vacuum pressing under the conditions of a temperature increasing rate of 5° C./minute, a holding time of one hour at 190° C., and a lamination pressure of 30 kg/cm².

Thereafter, manufacturing steps identical to those in the first example were performed to obtain a laminated board as shown in FIG. 22.

For the obtained CFRP core substrate, insulation resistance between the CFRP core and electrically conductive layer 2b was examined. It was found that the insulation resistance when 1000 V was applied was not less than 5 GΩ in both of before and after applying radiation, and did not present any problem. Further, when a heat cycle test (−65° C. for 15 minutes ↔100° C. for 15 minutes, 500 cycles) was conducted, no short circuit, break, or the like occurred, and no exfoliation or the like was found on the side surface of the substrate. Furthermore, when a large-sized ceramic component (approximately 10 mm×approximately 20 mm×approximately 4 mm) was mounted on the CFRP core substrate described above and a heat cycle test (−30° C. for 15 minutes ↔100° C. for 15 minutes, 500 cycles) was conducted, no crack occurred in a solder joint portion.

In the final step, the outer peripheral edge of CFRP core 5 that was not able to be coated with coating layer 2c or 6 due to a size-related problem was coated with resin layer 32 applied as shown in FIG. 26. The coating with resin layer 32 was performed by sticking a low adhesive tape on a portion (such as a portion on a interconnection portion) other than a portion to be coated, applying Million Clear (a chemically resistant epoxy resin clear paint (manufactured by Kansai Paint Co., Ltd.)) diluted with a thinner to the portion to be coated, either with a brush or by spraying, and then drying and curing the paint in an oven at a temperature of 100° C. for one hour.

The present invention is particularly advantageously applicable to a printed interconnection board having a core including CFRP and a method of manufacturing the same.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A printed interconnection board, comprising:
   a pair of signal circuit layers each having a signal interconnection;
   a core including carbon fiber reinforced plastic having a primary through hole provided between said pair of signal circuit layers;
   an adhesive member bonding said pair of signal circuit layers and said core, coating a wall surface of said primary through hole in said core, and having a secondary through hole extending within said primary through hole;
   a first electrically conductive layer formed on a wall surface of said secondary through hole for electrically connecting said signal interconnections of said pair of signal circuit layers via said secondary through hole; and
   a coating layer coating an outer peripheral edge of said core as seen in a plan view, and said coating layer including said adhesive member and a second electrically conductive layer, and
   said outer peripheral edge of said core as seen in a plan view is coated with said adhesive member, and a portion of said outer peripheral edge not coated with said adhesive member is coated with said second electrically conductive layer.

2. The printed interconnection board according to claim 1, wherein said first electrically conductive layer and said second electrically conductive layer are made of an identical material.

3. The printed interconnection board according to claim 1, further comprising a top surface side electrically conductive pattern and a bottom surface side electrically conductive pattern formed on a top surface side and a bottom surface side of said core, respectively, with said adhesive member interposed therebetween, wherein said second electrically conductive layer is made of an electrically conductive material formed by plating, and said top surface side electrically conductive pattern and said bottom surface side electrically conductive pattern are electrically connected with each other by said second electrically conductive layer.

4. The printed interconnection board according to claim 3, wherein a short-circuited through hole penetrating said top surface side electrically conductive pattern, said bottom surface side electrically conductive pattern, said adhesive member, and said core is formed, the printed interconnection board further comprises a third electrically conductive layer formed on a wall surface of said short-circuited through hole, and said top surface side electrically conductive pattern and said bottom surface side electrically conductive pattern are electrically connected by said third electrically conductive layer.

5. The printed interconnection board according to claim 1, wherein said second electrically conductive layer is electrically short-circuited with said core.

6. The printed interconnection board according to claim 1, wherein said coating layer includes a resin layer, and of said outer peripheral edge of said core as seen in a plan view, a portion of said outer peripheral edge not coated with said adhesive member and said second electrically conductive layer is coated with said resin layer.

7. The printed interconnection board according to claim 1, wherein said coating layer coats an entire periphery of said outer peripheral edge of said core as seen in a plan view.

8. The printed interconnection board according to claim 1, wherein said adhesive member contains an inorganic filler and a rubber component.

* * * * *